United States Patent
Kim et al.

(10) Patent No.: US 7,573,932 B2
(45) Date of Patent: Aug. 11, 2009

(54) SPREAD SPECTRUM CLOCK GENERATOR

(75) Inventors: Kyu-Hyoun Kim, Gyeonggi-do (KR); Hoe-Ju Chung, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 666 days.

(21) Appl. No.: 10/837,391

(22) Filed: Apr. 29, 2004

(65) Prior Publication Data

US 2005/0053120 A1    Mar. 10, 2005

(30) Foreign Application Priority Data

Sep. 8, 2003    (KR) ..................... 10-2003-0062863

(51) Int. Cl.
*H04B 1/00* (2006.01)
(52) U.S. Cl. ................. 375/130; 375/354; 375/359; 713/400; 713/500; 713/600; 713/401
(58) Field of Classification Search ............... 375/359, 375/130, 354; 713/500, 401, 400, 600
See application file for complete search history.

(56) References Cited

U.S. PATENT DOCUMENTS

| | | | |
|---|---|---|---|
| 5,180,938 A * | 1/1993 | Sin ..................... | 327/288 |
| 5,631,920 A | 5/1997 | Hardin | |
| 6,292,507 B1 * | 9/2001 | Hardin et al. ............. | 375/130 |
| 6,351,485 B1 | 2/2002 | Soe et al. | |
| 6,501,307 B1 * | 12/2002 | Yen ..................... | 327/113 |
| 6,518,813 B1 | 2/2003 | Usui | |
| 6,621,315 B2 * | 9/2003 | Heo et al. ............... | 327/158 |
| 6,643,317 B1 * | 11/2003 | Blumer ................. | 375/130 |
| 6,647,052 B2 * | 11/2003 | Hailey ................. | 375/130 |
| 7,187,705 B1 * | 3/2007 | Richmond .............. | 375/130 |
| 2002/0071363 A1 * | 6/2002 | Koudo et al. ........... | 369/47.48 |
| 2003/0001635 A1 * | 1/2003 | Lee et al. ............... | 327/158 |
| 2003/0169086 A1 * | 9/2003 | Lee et al. ............... | 327/158 |
| 2005/0069019 A1 * | 3/2005 | Kaizuka ................ | 375/130 |
| 2005/0073889 A1 * | 4/2005 | Kang ................... | 365/189.12 |

FOREIGN PATENT DOCUMENTS

| | | |
|---|---|---|
| DE | 19860909 A1 | 12/1998 |
| EP | 1137186 B1 | 7/2004 |
| JP | 04-326812 | 11/1992 |
| JP | 05-120219 | 5/1993 |
| JP | 11-074783 | 3/1999 |
| JP | 2001-331236 | 11/2001 |
| KR | 2000-0053958 | 9/2000 |
| KR | 2002-0029934 | 4/2002 |
| WO | WO 01/17102 A1 | 3/2001 |
| WO | WO 02/29975 | 4/2002 |

* cited by examiner

*Primary Examiner*—Juan A Torres
(74) *Attorney, Agent, or Firm*—Marger Johnson & McCollom, P.C.

(57) ABSTRACT

A spread spectrum clock generator includes a non-volatile memory to store control codes corresponding to a predetermined delay. A delay circuit receives a control code having a predetermined number of bits that determine a delay to apply to a fixed clock signal a period of time. The delay mitigates the electromagnetic interference caused by a periodic clock signal.

17 Claims, 7 Drawing Sheets

SPREAD SPECTRUM CLOCK GENERATOR

This application claims priority from Korean patent application number 2003-62863 filed Sep. 8, 2003 that we incorporate herein by reference.

BACKGROUND OF THE INVENTION

1. Field of the Invention

The present invention relates to a spread spectrum clock generator and a method of generating a spread spectrum clock.

2. Description of the Related Art

Figure 1:
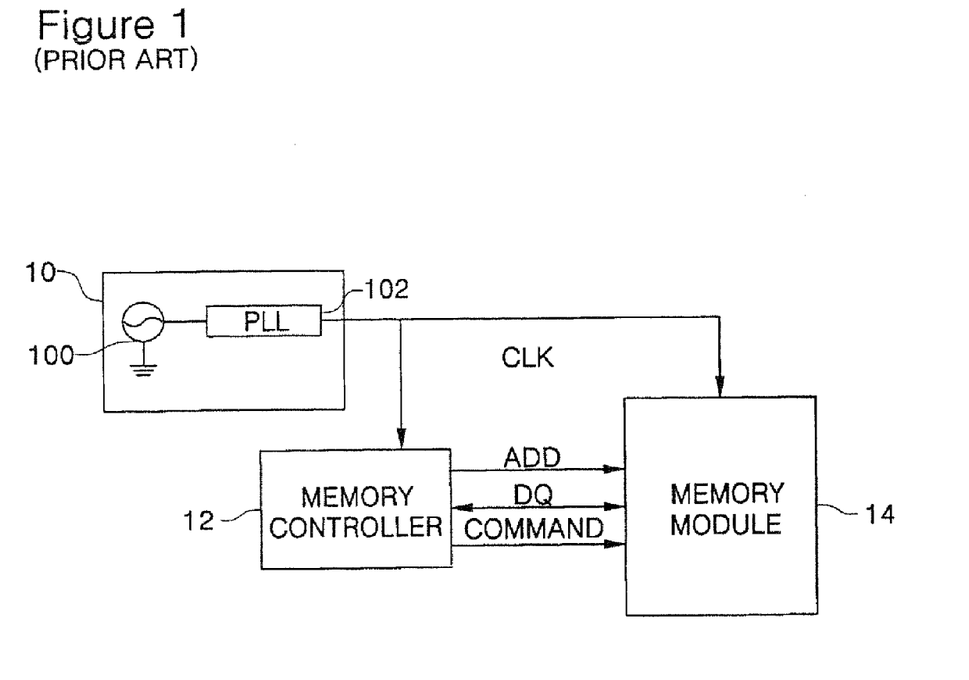
FIG. 1 shows a prior art embodiment of a memory system.

A clock generator, such as 10 in FIG. 1, generally comprises a clock source 100 and a phase-locked loop (PLL) 102. This generator 10 generates a system clock usually having square waves and a 50% duty cycle. The system clock is then used in many different types of systems, such as a memory system including a memory module 14 and a memory controller 12.

System clocks such as this can be a source of unwanted electromagnetic interference (EMI). EMI can cause problems in electronic circuits, as it interferes with signal transmission. As technology improves, circuits can operate faster, requiring faster clocks that in turn generate more EMI. One technique to alleviate EMI is to use spread spectrum clock generators (SSCG). These clocks are referred to as spread spectrum in that their frequency is spread out over different frequencies, avoiding the energy peaks at clock edges. In some instances, SSCGs are implemented using PLLs as shown in the US patents described below. PLLs vary the voltage to a voltage controlled oscillator (VCO), causing varying delays in the clock.

Examples of this approach are shown in U.S. Pat. No. 5,631,920, issued May 20, 1997; U.S. Pat. No. 6,292,507 issued Sep. 18, 2001; and U.S. Pat. No. 6,351,485, issued Feb. 26, 2002. The use of a PLL typically allows a clock cycle to be switched between two frequency limits, adjusting the clock frequency back and forth between them. This approach may be somewhat limited, as it only allows for two fixed frequencies to be used, and does not allow programmable control.

Figure 2:
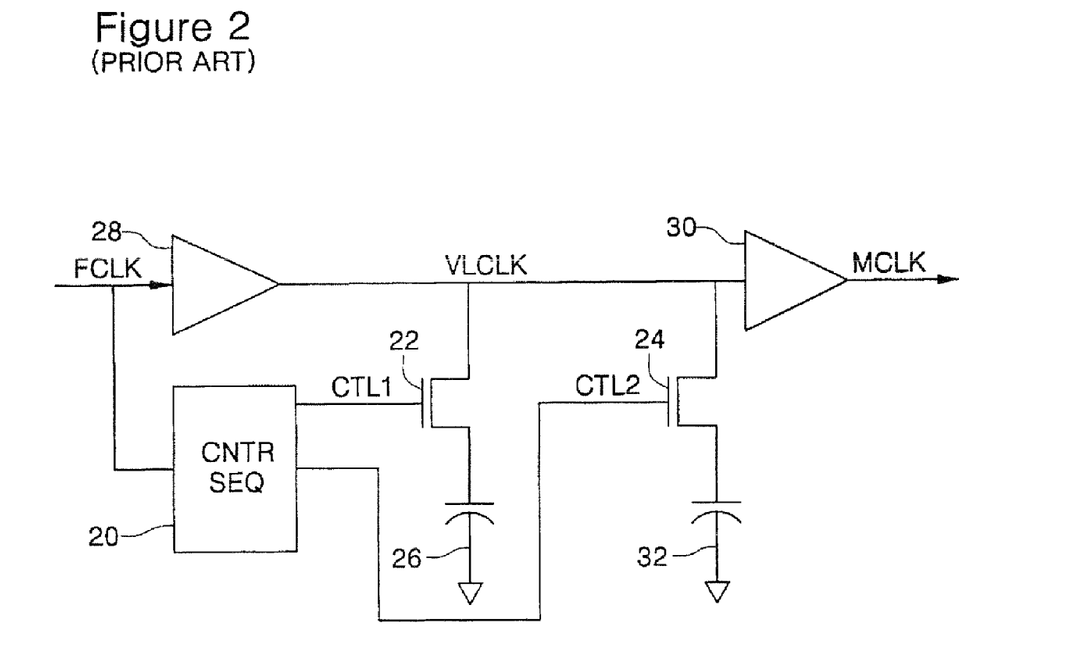
FIG. 2 shows a prior art embodiment of a spread spectrum clock generator.

Another approach is shown in U.S. Pat. No. 6,501,307, issued Dec. 31, 2002. As shown in FIG. 2, this approach has 2 capacitors used as loads switched by counter-sequencer 20, clocked by fixed clock FCLK. The counter-sequencer 20 drives first control signal CTL1 to the gate of load-switching transistor 22, and second control signal CTL2 to the gate of second load-switching transistor 24. When CTL1 is high, capacitor 26 has to be charged and discharged by input buffer 28 before the logic threshold of output buffer 30 is reached, thus delaying the clock edges. When CTL2 is high, capacitor 32 has to be charged and discharged by input buffer 28 before the logic threshold of output buffer 30 is reached, thus also delaying the clock edges. When both CTL1 and CTL2 are high, both capacitors have to be charged, further delaying the clock edges. However, these loads cannot be changed linearly to adjust the clock frequency as needed.

BRIEF DESCRIPTION OF THE DRAWINGS

The foregoing and other objects, features, and advantages of the invention will become more readily apparent from the detailed description of an embodiment that references the following drawings.

DETAILED DESCRIPTION OF THE PREFERRED EMBODIMENT

Figure 3:
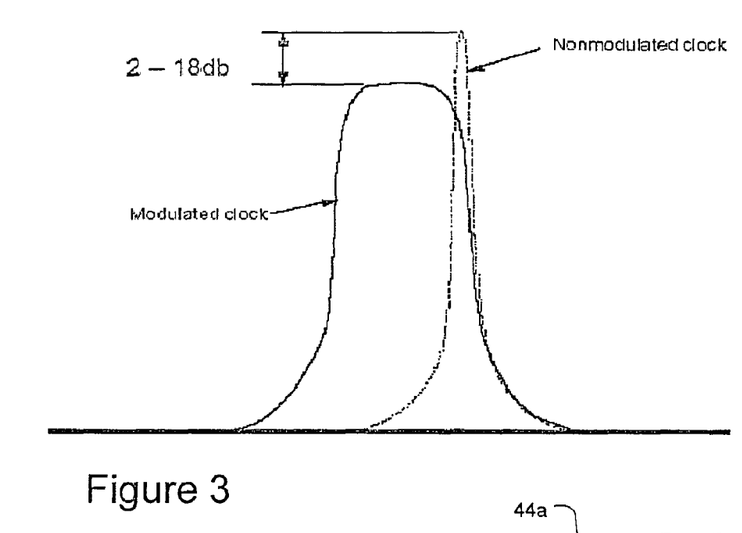
FIG. 3 shows a signal diagram of energy pulses associated with clock generators.

FIG. 3 shows the basis of the problem with nonmodulated clock signals. The energy spike from a nonmodulator clock may have an amplitude of two to eighteen dB beyond that of a modulated, or spread spectrum, clock signal. This difference causes a much higher level of EMI that can have negative effects on electronic components and systems such as memory systems. Examples discussed herein may rely upon memory system components and methods, but are merely intended as examples, and it must be understood that application of embodiments of the invention are not limited to memory systems.

Figure 4:
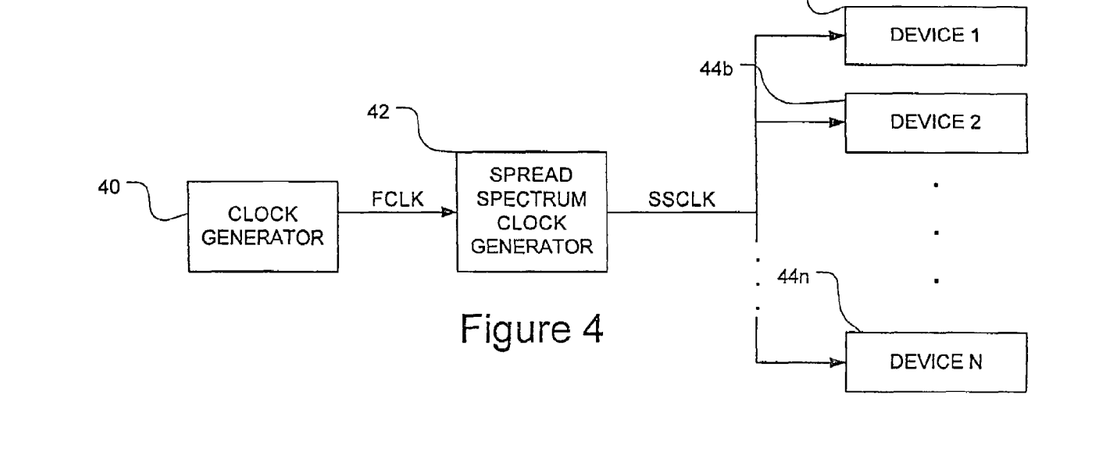
FIG. 4 shows an embodiment of memory system according to this invention.

An example of such a system is shown in FIG. 4. A clock generator 40 generates a fixed frequency clock, FCLK, that is used by the spread spectrum clock generator (SSCG) 42. SSCG 42 produces a spread spectrum clock and is in turn used by electronic devices 44*a* through 44*n*. In a memory system, the devices 44*a*-44*n* may be memory banks or memory module or memory device or registers used to store data.

Figure 5:
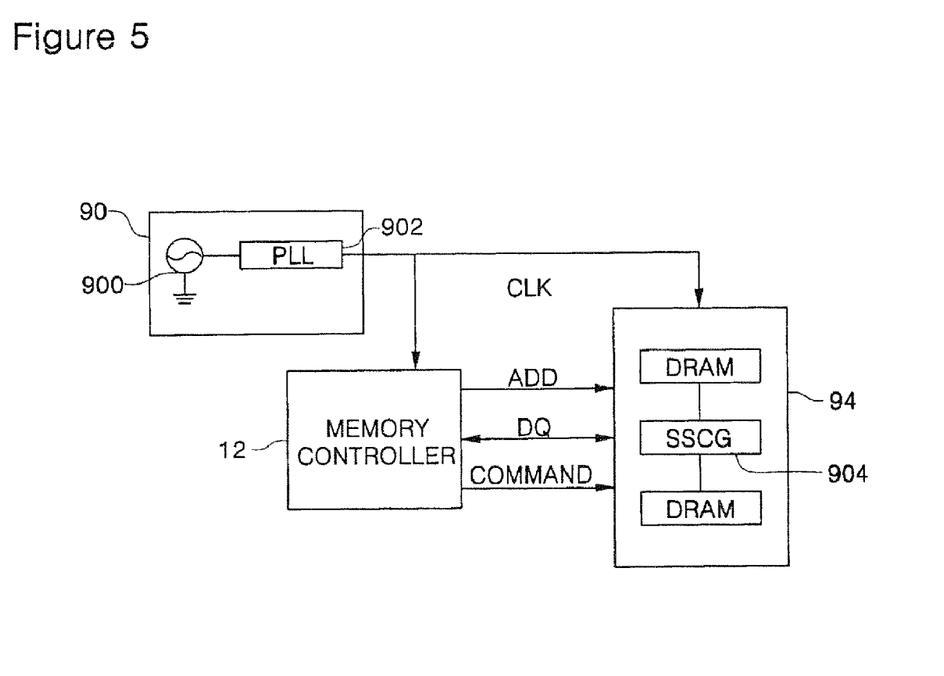
FIG. 5 shows an embodiment of a memory system employing a spread spectrum clock generator according to this invention.
Figure 6:
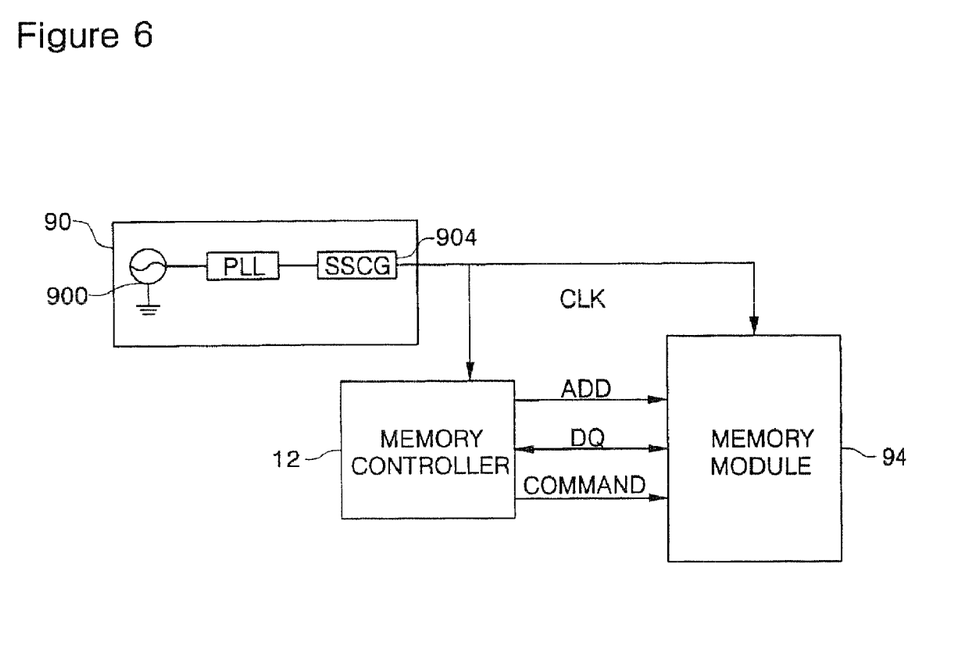
FIG. 6 shows an alternative embodiment of a memory system employing a spread spectrum clock generator according to this invention.

Alternative embodiments of a memory system employing a spread spectrum clock generator are shown in FIGS. 5 and 6. In FIG. 5, the clock generator 90 includes fixed frequency clock 900 and a phase locked loop 902. The memory module 94 includes individual memory modules and the spread spectrum clock generator 904.

Figure 7:
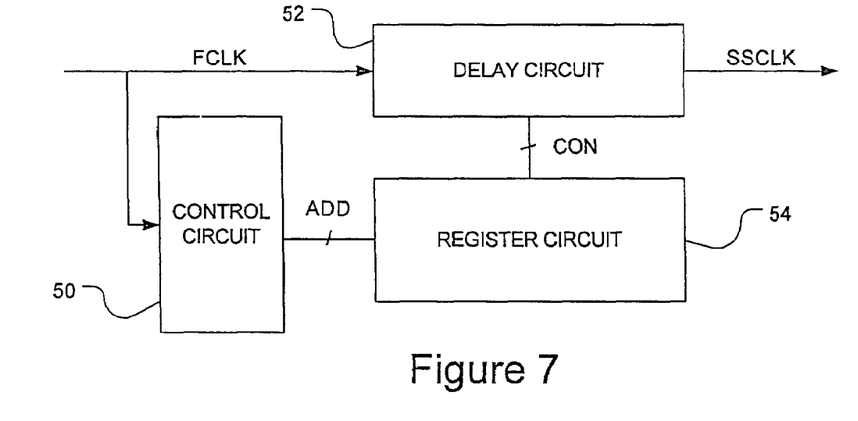
FIG. 7 shows an embodiment of a spread spectrum clock generator according to this invention.

The SSCG is shown in a more detailed embodiment in FIG 7. In this embodiment, the SSCG 42 has a control circuit 50, a programmable delay circuit 52 and a register circuit 54. The register circuit 54 holds control codes that program the delay circuit 52. The control circuit 50 provides the addresses to the register circuit 54, which in turn provides the control codes to the delay circuit. This allows the delay to alter a delay period applied to a fixed clock FCLK, changing the frequency of the clock to alleviate the EMI of a periodic clock.

Figure 8A:
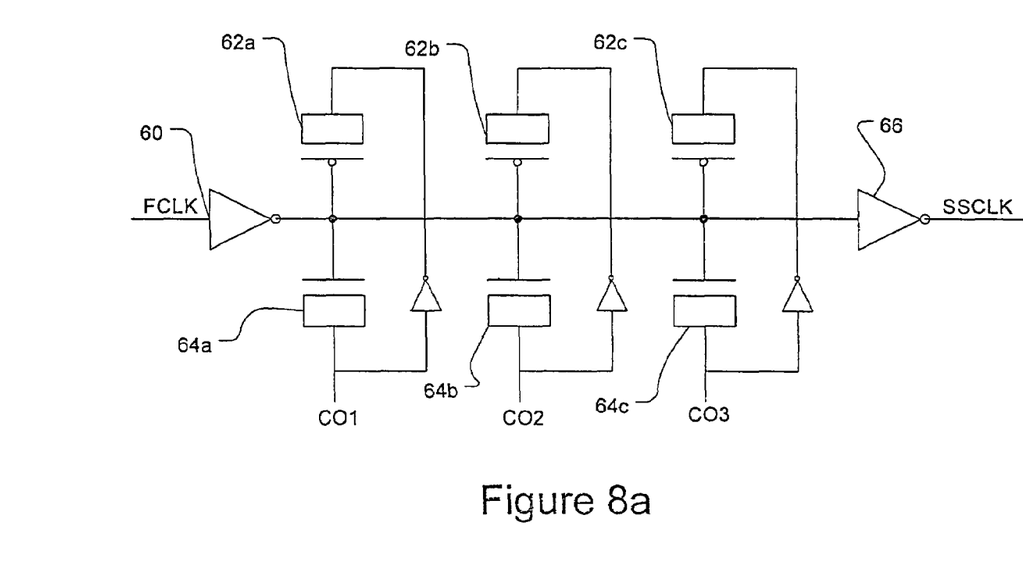
FIG. 8*a*-8*b* show alternative embodiments of a delay circuit according to this invention.

The programmable delay may be implemented by one of many sets of delaying components. Two examples are provided in FIGS. 8*a* and 8*b*, but it must be noted that these are merely examples of delay components. Embodiments of the invention generally provide components that can be selected by the control codes provided from the register circuit, allowing precise control of the delay in a spread spectrum clock generator. In the example of FIG. 8*a*, the delay elements are oppositely arranged capacitors, such as NMOS and PMOS capacitances. The fixed clock, FCLK, is buffered by inverting input buffer 60. If the FCLK signal is high, the inverted signal is low. This causes a low signal to be at one terminal of the PMOS capacitances 62a, 62b and 62c. If the control code for a particular component is low, the PMOS capacitance for that component will provide 100% of the capacitance, causing a delay equal to the charging time of the component.

For example, if the control code CO1 is low, the capacitor 62a provides 100% of the capacitance that will need to charge before the signal can pass to the output inverter 66. If the control code CO1 is high, the capacitor 62a provides substantially ⅓ of the capacitance that would need to charge before the signal passes to the output inverter 66.

If the clock signal FCLK is low, the output of the inverter 60 is high. This causes the NMOS capacitors 64a-64c to be the line loads for the signal prior to reaching the output inverter 66. In this manner, the amount of delay can be programmed by the control codes, in conjunction with the input clock signal FCLK.

Figure 8B:
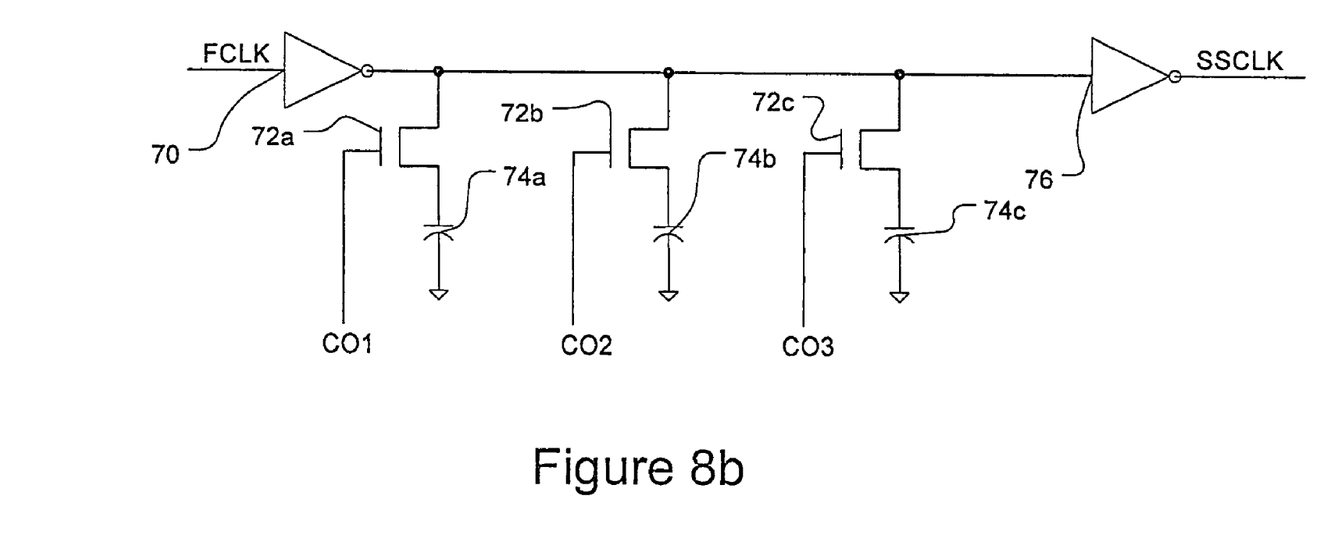

Another example of a delay circuit is shown in FIG. 8b. Each delay component in this embodiment has an access transistor such as 72a and a capacitor such as 74a. When the control code for a particular component is high, the access transistor turns on and the capacitor will charge, causing a delay. For example, if the control code CO1 is high, the transistor 72a turns on and capacitor 74a will charge. This causes a delay in the transmission of the signal from the input inverter buffer 70 to the output inverter buffer 76. Each additional capacitor that turns on will cause the capacitors to charge, thereby increasing the delay.

The capacitors of FIGS. 8a and 8b may all have the same value, or may all have differing values. For example, each capacitor may have a charging time that is equal to a unit amount of delay, d. Alternatively, the charging time of each capacitor may be controlled so as to have a binary equivalent. For example, the 'a' capacitors may have a charging time equal to the unit amount of delay, d. The 'b' capacitors may have a charging time equal to twice the unit amount of delay, 2d, or d+1. The 'c' capacitors may have a charging time equal to four times the unit amount of delay, 4d or d+3.

Figure 9:
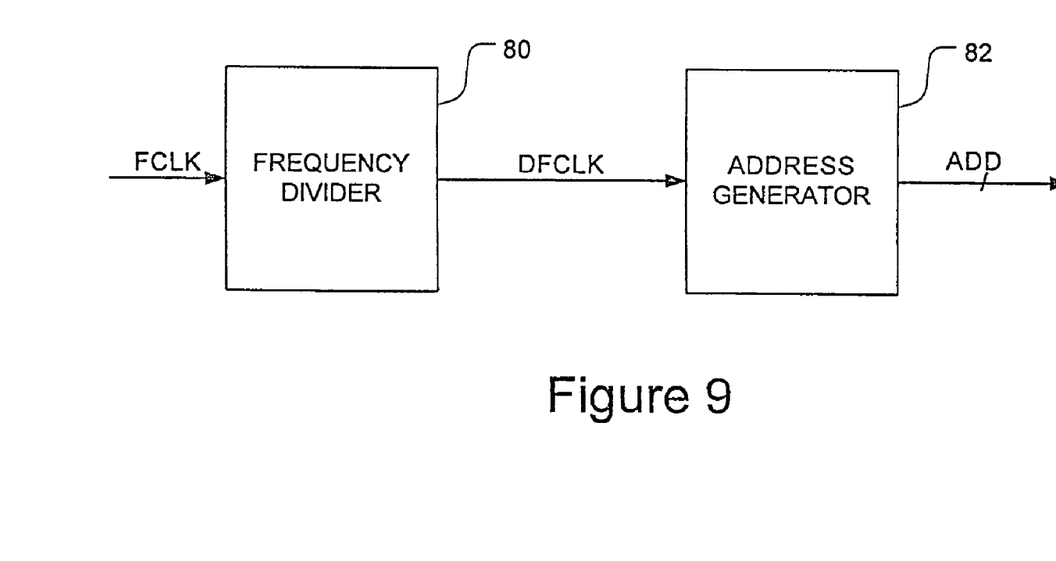
FIG. 9 shows an embodiment of a control circuit for a spread spectrum clock generator according to this invention.

Turning now to the control circuit 50 of the SSCG, an embodiment is shown in FIG. 9. The control circuit 50 may comprise a frequency divider 80 for generating a lower frequency clock DFCLK and an address generator 82. The address generator may be implemented as a state machine, where the output of a new address signal causes the machine to change state to the next state. The number of addresses needed may be known, as the number of combinations of control code values, or control words, may be finite.

For example, there may only be four control 'words' used to activate the delay circuit. Four addresses, 1000, 0100, 0010, and 0001, may be used. An address generator to generate the addresses is shown in FIG. 10.

Figure 10:
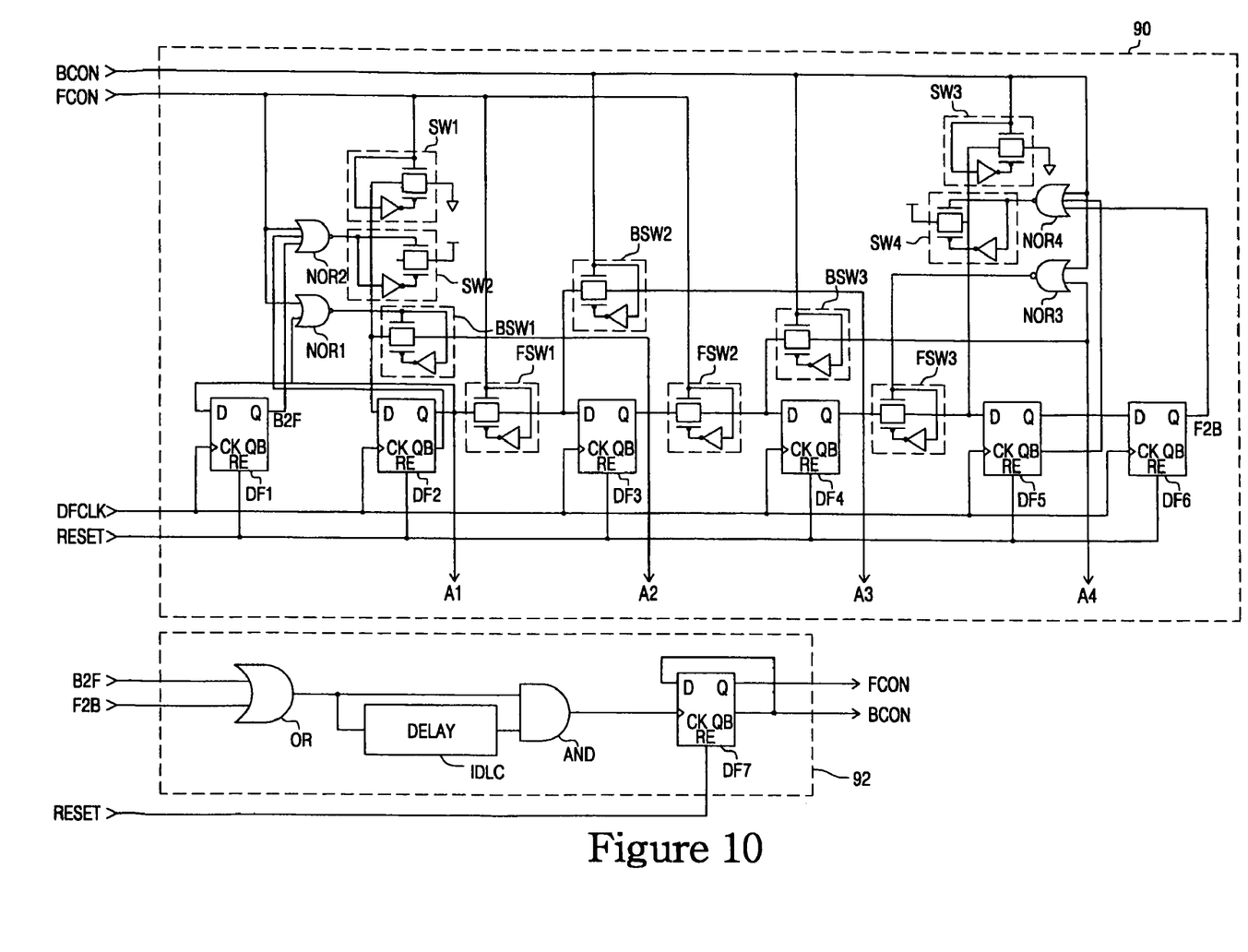
FIG. 10 shows an embodiment of an address generator according to this invention.

FIG. 10 is a circuit diagram showing a configuration of the address generator shown in FIG. 9. The address generator includes an overflow detection and shift register 90 and a forward and backward shift control signal generation circuit 92.

In FIG. 10, the overflow detection and shift register 90 includes a bidirectional shift register configured with D flip-flops DF2-DF4, switches FSW1-FSW3, BSW1-BSW3, and SW1-SW4 and NOR gates NOR1-NOR4, and an overflow detection circuit configured with D flip-flops DF1 and DF6.

The forward and backward shift control signal generation circuit 92 includes a pulse generation circuit configured with an OR gate OR, an AND gate AND and an inversion delay unit IDLC, and a toggling circuit configured with a D flip-flop DF7.

In FIG 10, the D flip-flops DF1 and DF3-DF7 have a data input terminal D, a clock signal input terminal CK, an output terminal Q, an inversion output terminal QB and a reset terminal RE, and the D flip-flop DF2 has a data input terminal D, a clock signal input terminal CK, an output terminal Q, an inversion output terminal QB, and a set terminal SE. Each of the switches SW1-SW3, FSW1-FSW3, and BSW1-BSW3 is configured with a CMOS transfer gate and an inverter.

Next, the function of each block of the circuit shown in FIG. 10 will be described.

When a forward shift control signal FCON is generated, the overflow detection and shift register 90 shifts address signals A1-A4 in the forward direction in response to a clock signal DFCLK. When the address signal A4 is "1", an overflow detection signal F2B is generated and the address signal A4 of "1" is generated once more. When a backward shift control signal BCON is generated, the overflow detection and shift register 90 shifts the address signals A1-A4 in the backward direction in response to the clock signal DFCLK. When the address signal A1 is "1", an overflow detection signal B2F is generated and the address signal A1 of "1" is generated once more. That is, the bidirectional shift register performs the forward shift operation in response to the forward shift control signal FCON and performs the backward shift operation in response to the backward shift control signal BCON. When the address signal A1 of "1" is generated, the most significant bit may be activated, and the address signal A1 of "1" is generated once more and then the address signals A2-A4 are shifted. When the address signal A4 of "1" is generated, the least significant bit may be activated, and the address signal A4 of "1" is generated once more and then the address signals A1-A3 are shifted. Persons having skill in the art will recognize that the A1 may be either the least significant bit or the most significant bit, and A4 may be either the least significant bit or the most significant bit. When the address signal A1 of "1" is generated, the overflow detection circuit generates the address signal A1 of "1" as the overflow detection signal B2F in response to the clock signal DFCLK. When the address signal A4 of "1" is generated, the overflow detection circuit generates the address signal A4 of "1" as the overflow detection signal F2B in response to the clock signal DFCLK.

When the overflow detection signals B2F and F2B are generated, the forward and backward shift control signal generation circuit 92 toggles the forward shift control signal FCON and the backward shift control signal BCON. That is, when the overflow detection signals B2F and F2B are generated, the pulse generation circuit generates a pulse signal. The toggling circuit is reset in response to a reset signal RESET, and toggles the forward shift control signal FCON and the backward shift control signal BCON in response to the pulse signal output from the pulse generation circuit.

When a reset signal, RESET, is applied, address signals A1-A4 are generated to 1000. A flip-flop generating address signal A1 generates a high signal in response to a set signal SE. Once the address signal A1 is generated, the high data of the A1 signal is shifted to a next address signal whenever the divided clock DFCLK is toggled. This results in address signals A1-A4, 0100, 0010, and, 0001. These are enabled in this sequence when a forward enable signal FCON is enabled.

After the final address A4 is activated (A1-A4 0001), a backward enabled signal BCON is enabled. This allows the high data of the A4 signal to be output in reverse order, A3, A2 and A1. Accordingly, the address signals A1-A4 are changed with order such as 0010, 0100 and 1000. The switches are either forward switches FSW1-FSW3, or backward switches BSW1-BSW3. This process of address generation is continuously repeated in order to generate address signals in response to the divided clock DFLCK. The value of the delay load can be changed with an edge variation as will be discussed with regard to FIG. 11.

Figure 11:
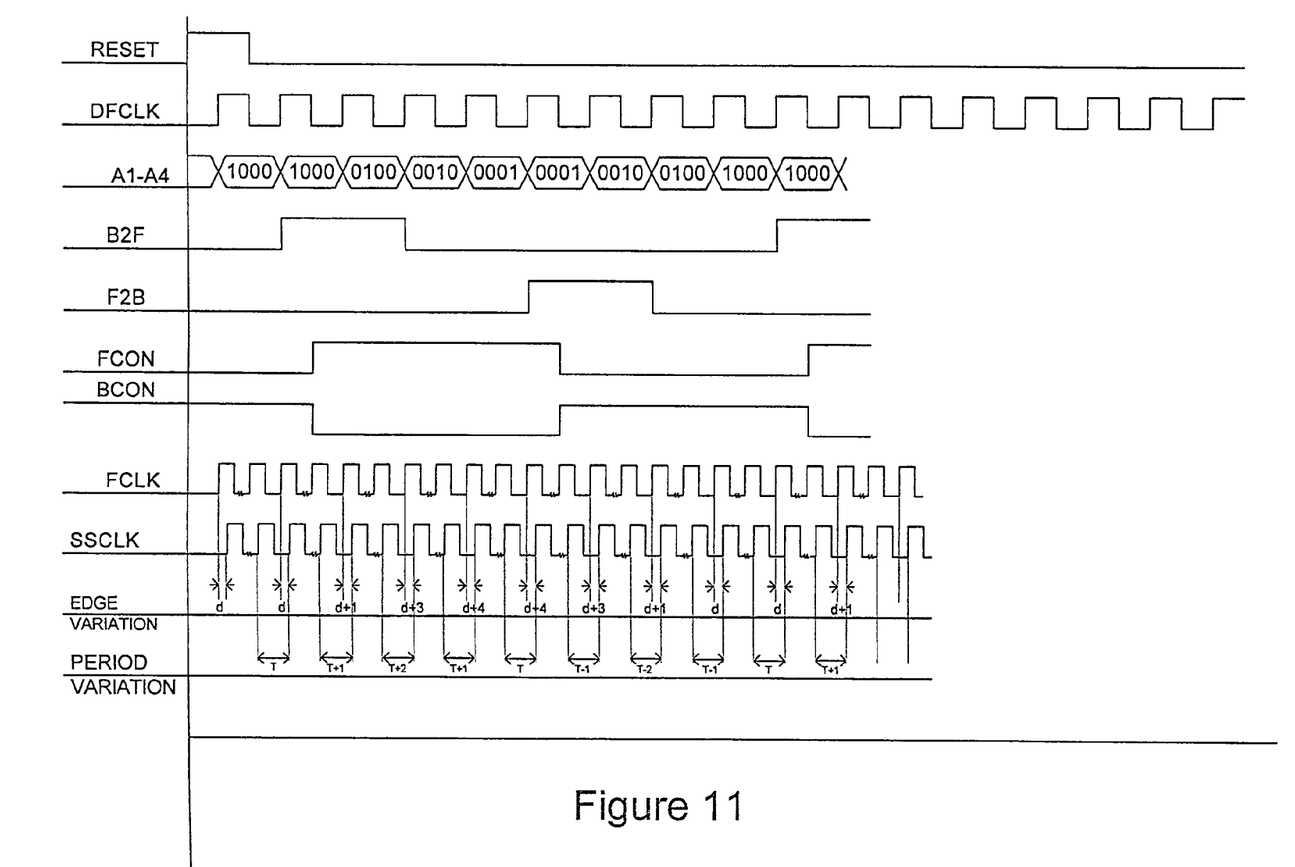
FIG. 11 shows a timing diagram for a spread spectrum clock generator according to this invention.

In FIG. 11, the timing of the signals for address generation is shown. The reset signal initiates the process. The two clock signals, FCLK and the divided clock, DFCLK are also shown. In this particular embodiment, the DFCLK has a frequency that is half that of the fixed clock. Other frequency divisions may also be used.

The forward control and backwards control signals FCON and BCON are generated from the B2F and F2B signals as shown in FIG. 10. Their related timing signals are shown in FIG. 10. The resulting spread spectrum clock signal, SSCLK, has a delay associated with it. For example, the period T is the period of the fixed clock signal plus a unit of delay, d. The number of delay units added to the clock signal can be programmed to vary according to the desires of the system designer. In the example of FIG. 11, the period T+1 has a delay of d+1; the period T+2 has a delay d+3, and period T+1, has a delay of d+4. As the addresses cycle backwards, the delays also cycle backwards, as shown in FIG. 11.

The delays shown are determined by the control signals that reside at the addresses A1-A4. The below table shows the control signals C01, C02 and C03, in their control 'words' and their corresponding addresses. Referring back to FIG. 7, it can be seen that the addresses provided to the address circuit results in a particular control code being provided to the delay components as discussed above. An example of some control codes provided are shown in the below table.

| Address | Control Signal | | |
|---------|-----|-----|-----|
|         | CO1 | CO2 | CO3 |
| 0001    | 0   | 0   | 0   |
| 0010    | 1   | 0   | 0   |
| 0100    | 1   | 1   | 0   |
| 1000    | 0   | 0   | 1   |

This particular example assumes that there are 3 delay components as shown in FIGS. 8a and 8b. However, it must be noted that any number of delay components could be used, as well as any number of control codes. Further, the nature of the control codes themselves may vary. The control codes may be a binary representation of the delay, where a delay control code of 001 would result in a delay of 1, while a delay control code of 100 would result in a delay of 4.

Alternatively, the control codes may be equally weighted representations. The control code 100 may be a delay of 2. For example, the equally-weighted representations are included in the table below.

| Address | Control Signal | | | | |
|---------|-----|-----|-----|--------|-------|
|         | CO1 | CO2 | CO3 | Binary | Equal |
| 0001    | 0   | 0   | 0   | 0      | 1     |
| 0010    | 1   | 0   | 0   | 4      | 2     |
| 0100    | 1   | 1   | 0   | 5      | 3     |
| 1000    | 0   | 0   | 1   | 1      | 4     |

In either case, the code may represent a number of repetitions of the delay.

In one embodiment, the register circuit could be eliminated, using the address as the control code. However, this removes one level of modularization that would otherwise provide more flexibility in the programmability of the delay circuit. For example, the register circuit could be reprogrammed or replaced with a new register circuit that would have different values for the predetermined addresses.

Suppose the delay associated with address 0001 was desired to be 4 instead of 0. Allowing removal or reprogramming of the existing register circuit having the control codes above is possible because of the register circuit being separated from the address generator. The register circuit could be any type of non-volatile memory such as an erasable electronically programmable read only memory (EEPROM), a fuse array, an electronically programmable read-only memory (EPROM), a read-only memory (ROM), etc.

Having illustrated and described the principles of embodiments of the invention, it should be readily apparent to those skilled in the art that the embodiments can be modified in arrangement and detail without departing from such principles. All modifications coming within the spirit and scope of the accompanying claims are claimed.

We claim:

1. A spread spectrum clock generator, comprising:
a delay circuit to receive a fixed clock signal and to delay a delay time of the fixed clock signal by repetitively increasing from a minimum delay time to a maximum delay time and decreasing from the maximum delay time to the minimum delay time in response to a control code to generate a spread spectrum clock signal;
a register circuit to store control codes and to receive an address signal to generate a control code corresponding to the address signal; and
a control circuit receiving the fixed clock signal to vary and generate the address signal for the register circuit using the fixed clock signal, the control circuit comprising:
a frequency divider to receive the fixed clock signal to generate a frequency-divided clock signal; and
an address generator to generate the address signal in response to the frequency divided clock signal,
wherein the address generator comprises:
an overflow detection and shift register configured to shift the address signal in a forward direction when a forward shift control signal is generated, to shift the address signal in a backward direction when a backward shift control signal is generated to generate the address signal, to generate the address signal once more when one of (a) a most significant and (b) a least significant bit of the address signal is activated, and to generate an overflow detection signal when an overflow of the address signal is detected; and
a forward and backward control signal generator configured to toggle the forward shift control signal and the backward shift control signal when the overflow detection signal is generated.

2. The spread spectrum clock generator of claim 1, wherein the register circuit comprises a non volatile memory.

3. The spread spectrum clock generator of claim 1, wherein the address generator comprises a counter or a shifter register.

4. The spread spectrum clock generator of claim 1, wherein the delay circuit comprises an inverter to invert the fixed clock signal and a series of delay elements.

5. The spread spectrum clock generator of claim 4, wherein the delay circuit further comprises metal-oxide semiconductor capacitors electrically connected to an output of the inverter, wherein each capacitor receives one bit of the control code.

6. The spread spectrum clock generator of claim 5, wherein the capacitor comprises one of the group comprised of: PMOS capacitor, NMOS capacitor.

7. The spread spectrum clock generator of claim 5, wherein the capacitors comprise an NMOS capacitor as a first load, and a PMOS capacitor as a second load.

8. The spread spectrum clock generator of claim 5, wherein each capacitor for each bit has a same capacitance value.

9. The clock generator of claim 5, wherein each capacitor for each bit has a capacitance different from capacitors for other bits.

10. The spread spectrum clock generator of claim 4, wherein the delay elements comprise an access transistor and a capacitor electrically connected to each bit of the control code.

11. The spread spectrum clock generator of claim 1, wherein the control code further comprises a binary-weighted value.

12. The spread spectrum clock generator of claim 1, wherein the control code further comprises an equally weighted value.

13. The spread spectrum clock generator of claim 1, wherein the control code further comprises a representation of a number of repetitions of a unit of delay.

14. The spread spectrum clock generator of claim 13, wherein the unit of delay is dependent upon an input frequency of the clock signal.

15. The spread spectrum clock generator of claim 1, wherein the overflow detection and shift register comprises:
    a predetermined number of first flip-flops being cascade-connected configured to shift the address signal in the forward direction responsive to the frequency-divided clock signal when the forward shift control signal is generated and to shift the address signal in the backward direction responsive to the frequency-divided clock signal;
    a first circuit configured to output an activation signal responsive to one of the first flip-flops among the predetermined number of first flip-flops generating the least significant bit of the address signal when the least significant bit is activated; and
    a second circuit configured to output the activation signal responsive to another of the first flip-flops among the predetermined number of first flip-flops generating the most significant bit of the address signal when the most significant bit is activated.

16. The spread spectrum clock generator of claim 15, wherein the overflow detection and shift register further comprise:
    a second flip-flop configured to generate the least significant bit of the address signal as the overflow detection signal responsive to the frequency-divided clock signal when the least significant bit is activated; and
    a third flip-flop configured to generate the most significant bit of the address signal as the overflow detection signal responsive to the frequency-divided clock signal when the most significant bit is activated.

17. The spread spectrum clock generator of claim 1, wherein the forward and backward control signal generator comprises:
    pulse generator configured to generate a pulse signal responsive to the overflow detection signal; and
    a flip-flop configured to be reset responsive to a reset signal and to toggle the forward shift control signal and the backward shift control signal responsive to the pulse signal.

* * * * *

UNITED STATES PATENT AND TRADEMARK OFFICE
CERTIFICATE OF CORRECTION

PATENT NO. : 7,573,932 B2
APPLICATION NO. : 10/837391
DATED : August 11, 2009
INVENTOR(S) : Kyu-Hyoun Kim et al.

Page 1 of 1

It is certified that error appears in the above-identified patent and that said Letters Patent is hereby corrected as shown below:

Column 8, line 28, the word "pulse" should read -- a pulse --.

Signed and Sealed this

Eighth Day of December, 2009

David J. Kappos
*Director of the United States Patent and Trademark Office*